(12) United States Patent
McMahon

(10) Patent No.: US 6,890,798 B2
(45) Date of Patent: May 10, 2005

(54) STACKED CHIP PACKAGING

(75) Inventor: John F. McMahon, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/768,580

(22) Filed: Jan. 23, 2001

(65) Prior Publication Data

US 2001/0006828 A1 Jul. 5, 2001

Related U.S. Application Data

(62) Division of application No. 09/327,608, filed on Jun. 8, 1999, now abandoned.

(51) Int. Cl.[7] .............................................. H01L 21/48
(52) U.S. Cl. ..................................................... 438/122
(58) Field of Search ................................ 438/109, 108, 438/125, 126, 127, 106, 121, 122; 257/678, 685, 686, 706, 707, 712, 713, 717, 720, 723, 724, 731, 732

(56) References Cited

U.S. PATENT DOCUMENTS

| 5,107,328 | A | | 4/1992 | Kinsman |
| 5,237,204 | A | * | 8/1993 | Val ............................. 257/698 |
| 5,241,450 | A | | 8/1993 | Bernhardt et al. |
| 5,247,423 | A | | 9/1993 | Lin et al. |
| 5,313,366 | A | * | 5/1994 | Gaudenzi et al. ........... 361/760 |
| 5,331,235 | A | | 7/1994 | Chun |
| 5,366,933 | A | | 11/1994 | Golwalkar et al. |
| 5,527,740 | A | | 6/1996 | Golwalkar et al. |
| 5,545,922 | A | | 8/1996 | Golwalkar et al. |
| 5,563,446 | A | * | 10/1996 | Chia et al. ................... 257/704 |
| 5,589,711 | A | | 12/1996 | Sano et al. |
| 5,629,563 | A | | 5/1997 | Takiar et al. |
| 5,633,530 | A | | 5/1997 | Hsu |
| 5,701,033 | A | * | 12/1997 | Ueda et al. ................... 257/704 |
| 5,719,436 | A | | 2/1998 | Kuhn |
| 5,767,564 | A | | 6/1998 | Kunimatsu et al. |
| 5,777,345 | A | | 7/1998 | Loder et al. |
| 5,786,230 | A | | 7/1998 | Anderson et al. |
| 5,869,896 | A | | 2/1999 | Baker et al. |
| 5,874,321 | A | * | 2/1999 | Templeton et al. ......... 438/107 |
| 6,023,413 | A | | 2/2000 | Umezawa |
| 6,150,724 | A | * | 11/2000 | Wenzel et al. .............. 257/777 |
| 6,333,856 | B1 | * | 12/2001 | Harju .......................... 361/761 |

FOREIGN PATENT DOCUMENTS

| JP | 61140140 A | * | 6/1986 | ........... H01L/21/58 |
| JP | 02026080 A | * | 1/1990 | ........... H01L/31/02 |
| JP | 4-219966 | | 8/1992 | |
| JP | 5-48000 | | 2/1993 | |
| JP | 5-102336 | * | 4/1993 | |
| JP | 5-275611 | | 10/1993 | |

* cited by examiner

Primary Examiner—Alonzo Chambliss
(74) Attorney, Agent, or Firm—Kathy J. Ortiz

(57) ABSTRACT

A multi-chip package and a method of manufacturing the same. The multi-chip package of the present invention has a plurality of shelves. A first semiconductor is electrically coupled to at least one of the package's shelves. A second semiconductor die is electrically coupled to at least one of the package's shelves, wherein the second semiconductor die is above said first semiconductor die.

11 Claims, 4 Drawing Sheets

STACKED CHIP PACKAGING

This is a Divisional application of Ser. No. 09/327,608 filed on Jun. 8, 1999, now abandon.

BACKGROUND OF THE INVENTION

1. Field of the Invention

The present invention pertains to the field of integrated circuit (IC) packaging. More particularly, the present invention relates to a three-dimensional (3D) multi-chip package design that provides a high performance, high-density packaging option within a single chip footprint.

2. Description of Related Art

Electronic circuits integrated in a semiconductor substrate are commonly housed within packages suited to the particular integrated circuit (IC) device. A typical semiconductor package comprises a leadframe which interconnects the IC to external circuitry located on an printed circuit board (PCB). A standard leadframe is larger than the size of the integrated circuit die so that bonding pad regions on the die can be wire-bonded to extensions or "fingers" of the leadframe. After the IC has been wire-bonded to the leadframe, the assembly is normally encapsulated in plastic or some other type of packaging material. Terminals connected to the leadframe fingers extend outside the packaging material to provide points of interconnection to other electronic components.

Most large-scale ICs are presently packaged in plastic or ceramic packages with metal leads extended therefrom for soldering to a PCB or for insertion into a socket. Typically, these IC packages are configured as dual-in-line or quad-flat packages. In most instances, only a single IC chip is contained within a package, although multiple chips are sometimes contained within a package. The circuit density resulting from this packaging technology is not very great since the ceramic or plastic package consumes relatively large areas of the mounting surface, usually a PCB, particularly if a socket is used.

Moreover, PCBs are becoming smaller and denser. A compact packaging technology is needed when mounting area is limited dictating that circuit elements be closely spaced. PCBs have typically been designed so that semiconductor devices in the form of packaged semiconductor die are mounted thereon to make a final circuit. For memory boards, the drive for increased memory capacity is limited by board space. Thus, when the size of the board is fixed, the number of devices that can possibly be mounted on the board is limited. A module consisting of a plurality of semiconductor devices is then used to densely dispose the semiconductor devices.

A continuing goal of the semiconductor industry is to maximize circuit density. One past scheme for increasing circuit density has been to house multiple semiconductor die in a single package. For example, an IC package containing two memory chips can double the density of a memory system without increasing the PCB area containing the memory chips. The problem with prior art multi-chip packages, however, is that they either require the use of a specially adapted custom package, or they impose size restrictions on the semiconductor dies that may be housed together. In addition, conventional dual die semiconductor packages often mandate a custom bonding pad routing for the IC's so that interconnection can be made to a single leadframe. Thus, past efforts of fabricating multi-chip packages have often resulted in costly package designs limited in use to specific die sizes or particular bonding pad configurations.

Several methods exist for fabricating a semiconductor multiple chip module. One such method uses a laminated co-fired ceramic substrate onto which bare semiconductor die are directly attached to the ceramic mounting surface and are wire bonded to conductive areas on the mounting surface, or are inverted and connected directly to metallized areas on the ceramic mounting surface by, for example, a solder-bump technique. This multiple chip module technology has several limitations, however. Interconnecting multiple IC's on a single ceramic mounting surface requires deposition of a metallic material in a pattern which desirably avoids cross-overs. Furthermore, a disadvantage of direct chip attach is the difficulty of burn-in before module assembly. Burn-in is performed to screen out weak devices. If a module fails during burn-in due to a weak device, the entire module must be discarded or repaired after burn-in, whereas if each component of the module could be burned-in prior to module assembly, the yield for functional modules can be increased.

Another method of fabricating a semiconductor multiple chip module involves tape automated bonded (TAB) semiconductor die to a flexible circuit leadframe. The semiconductor die are tested as discrete units before being mounted, or they can be tested in the final circuit form after the TAB process. After testing and reworking, the flexible circuit leadframe is encapsulated. The die and circuitry on the leadframe, except for outer portions of the leadframe, are encapsulated in a mold forming a single package body for the entire module. The disadvantage to this approach is that repair of the module after fabrication would cause the entire module to be rejected.

Another approach to form a multiple chip module is to stack pin grid arrays (PGAs) and/or ball grid arrays (BGAs). A bottom substrate is provided with copper pins in a conventional manner. Semiconductor die are then flip-chip mounted to chip carrier substrates. An interposer physically and electrically couples a chip carrier substrate to another chip carrier or to the bottom substrate by way of solder joining the interconnections. The metal pins of the PGAs and the interposers provide the stand-off between the carriers to keep them from collapsing onto each other.

Standard single package PGA and BGA options have not been capable of supporting multi-chip formats without expanding the footprint of the package. An expansion of the footprint of the package increases the needed length of the wiring traces on the substrates to interconnect the devices. As a result, an ever increasing need exists for other passive devices such as decoupling capacitors. Further, the pre-testing of each device requires the pre-packaging of each device that when assembled increases the trace lengths and interface joints.

SUMMARY OF THE INVENTION

The present invention describes a multi-chip package and a method of manufacturing the same. The multi-chip package of the present invention has a plurality of shelves. A first semiconductor die is electrically coupled to at least one of the package's shelves. A second semiconductor die is electrically coupled to at least one of the package's shelves, wherein the second semiconductor die is above the first semiconductor die.

BRIEF DESCRIPTION OF THE DRAWINGS

The invention is further described by way of example with reference to the accompanying drawings, wherein.

DETAILED DESCRIPTION OF THE INVENTION

A three dimensional (3D) multi-chip package design providing a high performance, high density packaging option within a single chip printed circuit board (PCB) plane footprint is described. In the following description, numerous specific details are set forth such as material types, processes, etc., in order to provide a more thorough understanding of the present invention. However, it will be obvious to one of skill in the art that the invention may be practiced without these specific details. In other instances, well-known elements and processing techniques have not been shown in particular detail in order to avoid unnecessarily obscuring the present invention.

A continuing goal of the semiconductor industry is to maximize circuit density. One approach in addressing this issue is to house multiple semiconductor die in a single package. The problem with prior art multi-chip packages, however, is that they require the use of a specially adapted custom package, or they impose size restrictions on the semiconductor dies that may be housed together. In addition, conventional dual die semiconductor packages often mandate a custom bonding pad routing for the integrated circuits (IC's) so that interconnection can be made to a single leadframe. Past efforts of fabricating multi-chip packages have often resulted in costly package designs limited in use to specific die sizes or particular bonding pad configurations. Further, standard single package pin grid array (PGA) and ball grid array (BGA) options have not been capable of supporting multi-chip formats without expanding the footprint of the package. An expansion of the footprint of the package increases the needed length of the wiring traces on the substrates to interconnect the devices. As a result, an ever increasing need exists for the passive devices such as decoupling capacitors. Further, the pre-testing of each device requires the pre-packaging of each device that when assembled increases the trace lengths and interface joints.

A three dimensional (3D) multi-chip package design providing a high performance, high density packaging option within a single chip printed circuit board (PCB) plane footprint is described. The multi-chip package described herein is unique in that it is a stacked structure in a given vertical direction, rather than a multi-chip package on the same or relatively same plane with the chips separated from each other on the footprint of the length and width of the PCB. Further, the multi-chip package of the present design provides routing for each of the chips within the package in the same single substrate. In other words, instead of placing the chips next to each other and using an increased footprint, the chips are now stacked upon one another to form a package with a single chip footprint. The stacked packages also provides the routing from one product to another.

Figure 1:
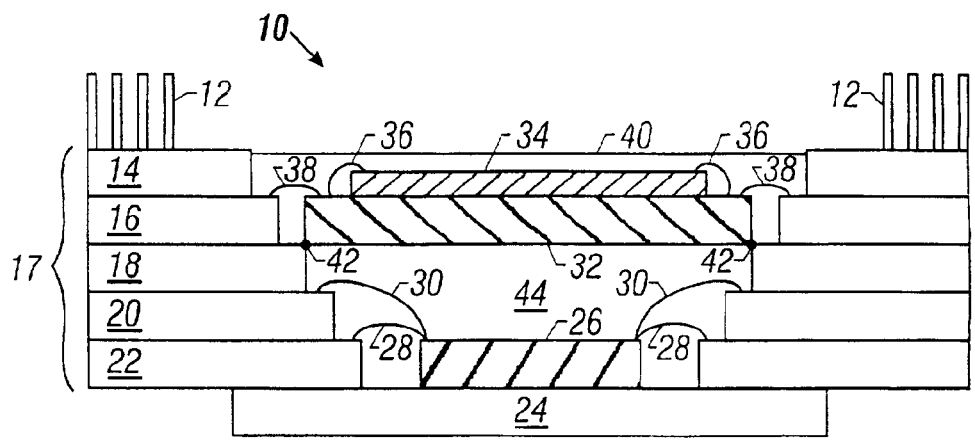
FIG. 1 is a multi-chip package of the present invention representing a ceramic PGA package with a standard CPU die with a wire bonded SRAM cache.

A first embodiment of the multi-chip package of the present invention is illustrated in the side cross-sectional view of FIG. 1. The multi-chip package 10 represents a ceramic PGA package 10 with a standard CPU die 26 with a wire bonded SRAM cache 34. The manufacturing process flow 48 for the multi-chip package 10 is illustrated in the flowchart of FIG. 2.

Figure 2:
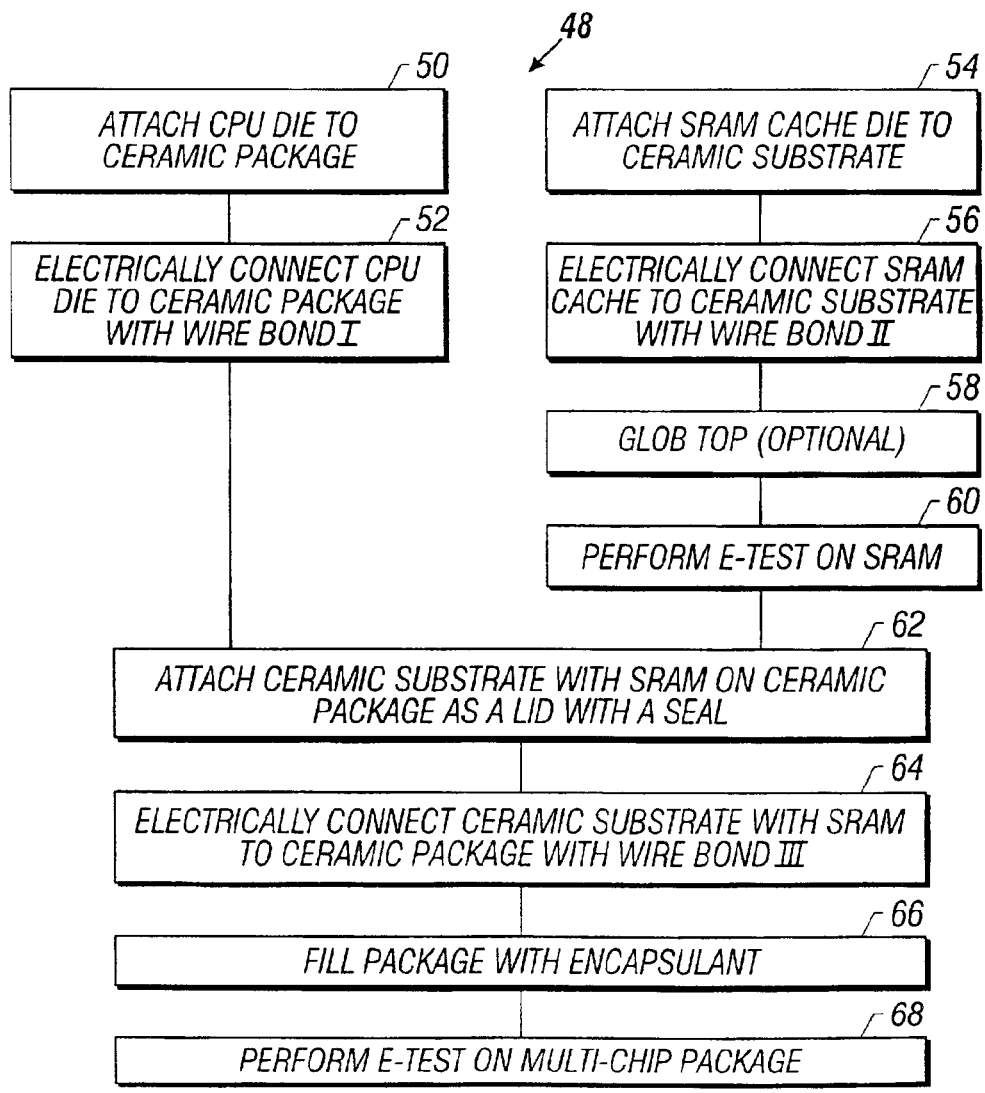
FIG. 2 is a manufacturing process flow for the multi-chip package illustrated in FIG. 1.

The multi-chip package 10 of FIG. 1 can be fabricated following the manufacturing flow 48 illustrated in FIG. 2. A CPU die 26 is first attached to a slug 24 (step 50). Note that the ceramic package 17 is comprised of a series of layers or shelves 14, 16, 18, 20, and 22, and has connector pins 12 brazed to the surface of the upper shelf 14 to allow the multi-chip package 10 to be electrically coupled to other devices (e.g., a PCB). In one embodiment, the CPU die 26 is attached to the slug 24 using a conductive epoxy. In one embodiment, the slug 24 is fabricated from either copper or tungsten. The slug 24 could also be fabricated from ceramic, and could even be a part of the ceramic package 17 (e.g., as a bottom layer or shelf or the package 17). The slug 24 supporting the CPU die 26 is then attached to the ceramic package 17. In one embodiment, the slug 24 is brazed to the base (i.e., the side opposite the connector pins 12) of the ceramic package 17, although other means of attachment may also be used.

Once the CPU die 26 and its supporting slug 24 have been attached to the ceramic package 17, the CPU die 26 is electrically connected to the package 17 via wire bonds I 28 and 30. Note the fabrication of a standard ceramic PGA package having a CPU device bonded to a plurality of shelves would end here. The partially fabricated chip package 10 could easily be tested for functionality at the point. However, testing at this point is purely optional.

The SRAM cache 34 is attached to a ceramic substrate 32 (step 54), typically through use of an epoxy die attach. Note that SRAM cache 34 is merely exemplary, any form of cache memory could be used following this same process flow. Once mounted thereon, the SRAM cache 34 is electrically connected to the ceramic substrate 32 by a wire bond II 36 (step 56). A glob top may or may not be used on the SRAM cache 34 and ceramic substrate 32, it is completely optional (step 58). Once the SRAM cache 34 is electrically coupled to the substrate 32, a functionality test is performed to verify performance of the SRAM chip (step 60). If the SRAM chip is satisfactory, fabrication of the multi-chip package 10 may continue, otherwise the SRAM chip will be replaced. A manufacturing process of a multi-chip package allowing for pre-testing of each of the individual chips prior to the fabrication of the actual multi-chip package, significantly improves the yields of the fabricated multi-chip packages while simultaneously lowering the cost associated with the fabrication of a multi-chip package. The time and cost saved by allowing each individual chip to be pre-tested prior to being bonded to the substrate package 17, allows a bad chip to be thrown away if it fails the individual testing while still allowing the remaining good chip to be used. In contrast, if the functionality testing occurs after the fabrication of the multi-chip package 10 and the device fails, the entire device must be thrown away.

Once the SRAM cache 34 mounted on the ceramic substrate 32 is tested and deemed satisfactory, the combined cache 34 and substrate 32 is attached to a shelf 18 of ceramic package 17, with the ceramic substrate 32 functioning as a lid above the CPU die 26 (step 62). Note that substrate 32 can have a metallized surface for traces, or can utilize a multi-layer ceramic approach. Regardless, the substrate 32 can function both as a lid for the multi-chip package 10 as well as a component for carrying a device such as the SRAM cache 34. A seal 42 is between the base of the substrate 32 and the upper edge of the shelf 18 it resides on. In one embodiment, the seal 42 is an eutetic seal; the seal 42 may also be an epoxy. In this manner, an open cavity 44 with no filler protects the CPU die 26. The seal 42 provides an environmental seal in addition to providing structural support between substrate 32 and package 17.

After the substrate 32 has been attached and sealed to the shelf 18 of the ceramic package 17, the substrate 32 is electrically connected to the ceramic package 17 using wire bond III 38 (step 64). In this manner, the SRAM cache 34 is electrically coupled to the chip package 17. The multi-chip package 10 is filled (above the SRAM cache 34 and substrate 32) with an encapsulant 40 (step 66). The types of encapsulant used may vary, however, one example is a plastic filler (e.g., polymer). Once the multi-chip package 10 is fully fabricated, a final functionality test may be applied to the device as a whole (step 68).

Figure 3:
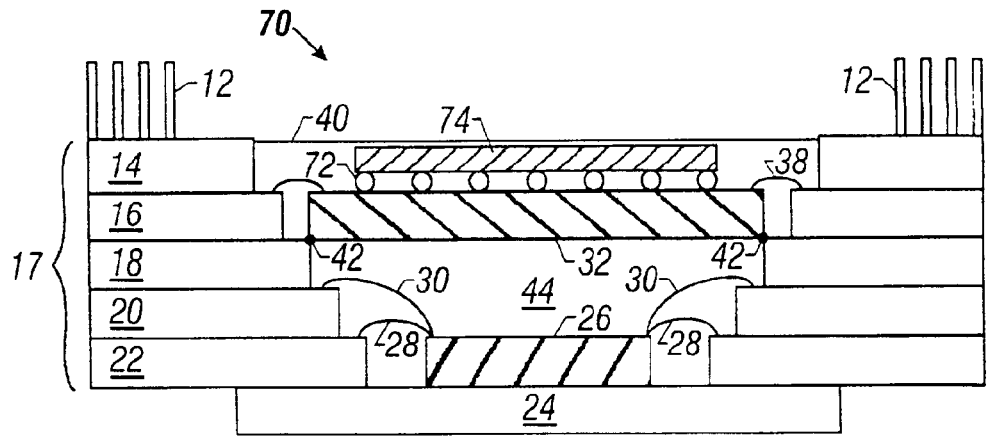
FIG. 3 is a multi-chip package of the present invention representing a ceramic PGA package with a standard wire bonded CPU die with a flip chip (C4) SRAM cache.
Figure 4:
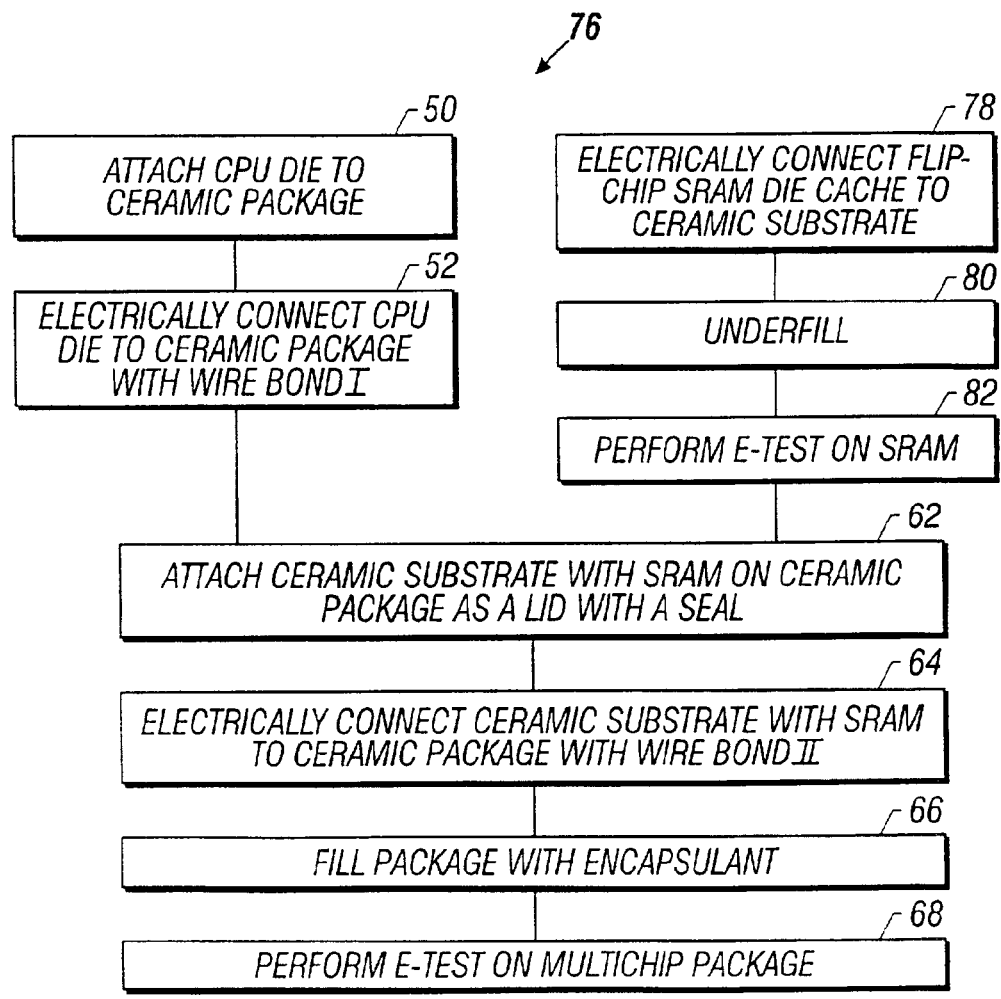
FIG. 4 is a manufacturing process flow for the multi-chip package illustrated in FIG. 3.

A second embodiment of the multi-chip package of the present invention is illustrated in the side cross-sectional view of FIG. 3. The multi-chip package 70 represents a ceramic PGA package 70 with a standard CPU die 26 with a C4, flip chip, SRAM cache 74. The manufacturing process flow 76 for multi-chip package 70 is illustrated in the flow chart of FIG. 4.

The multi-chip package 70 can be fabricated in a similar process flow as that discussed above with respect to multi-chip package 10. A CPU die 26 is first attached to a slug 24 (step 50). The slug 24 supporting the CPU die 26 is then attached to the ceramic package 17, where the CPU die 26 is electrically connected to the package 17 via wire bonds I 28 and 30 (step 52). The partially fabricated chip package 70 could easily be tested for functionality at this point. However, testing at this point is purely optional.

The SRAM cache 74 is mounted to a ceramic substrate 32 through use of solder balls 72 (step 78). A standard flip chip substrate may be used for the SRAM cache 74. An underfill coating (not shown) may be applied to further secure the SRAM cache 74 to the substrate 32, a functionality test is performed to verify performance of the SRAM chip (step 82). If the SRAM chip is satisfactory, fabrication of the multi-chip package 70 may continue, otherwise the SRAM chip will be replaced.

Once the SRAM cache 74 mounted on the ceramic substrate 32 is tested and deemed satisfactory, the combined cache 74 and substrate 32 is attached to a shelf 18 of ceramic package 17, with the ceramic substrate 32 functioning as a lid above the CPU die 26 (step 62). A seal 42 is between the base of the substrate 32 and the upper edge of the shelf 18 it resides on. In this manner, an open cavity 44, with no filler protects the CPU die 26. After the substrate 32 has been attached and sealed to the shelf 18 of the ceramic package 17, the substrate 32 is electrically connected to the ceramic package 17 using wire bond II 38 (step 64). In this manner, the SRAM cache 74 is electrically coupled to the chip package 17. The multi-chip package 70 is then filled (above the SRAM cache 34 and substrate 32) with an encapsulant 40 (step 66). Once the multi-chip package 70 is fully fabricated, a final functionality test may be applied to the device as a whole (step 68).

Figure 5:
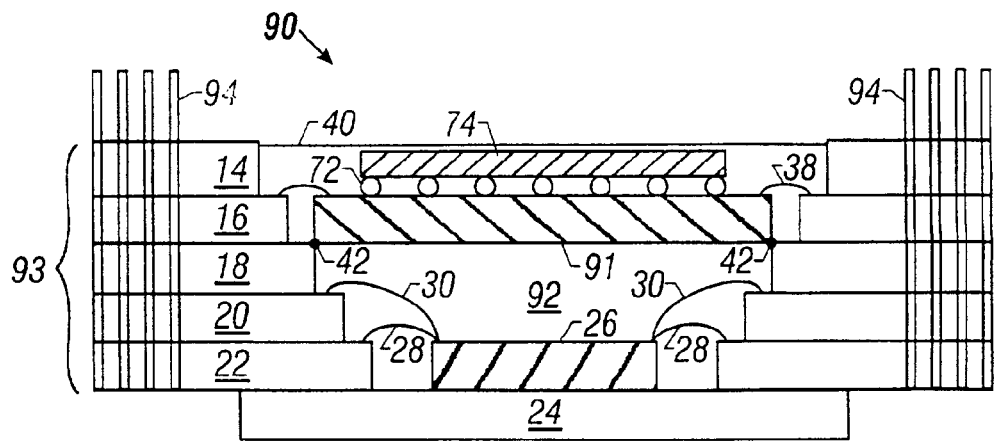
FIG. 5 is a multi-chip package of the present invention representing a PPGA package with a standard wire bonded CPU and a flip chip SRAM cache.
Figure 6:
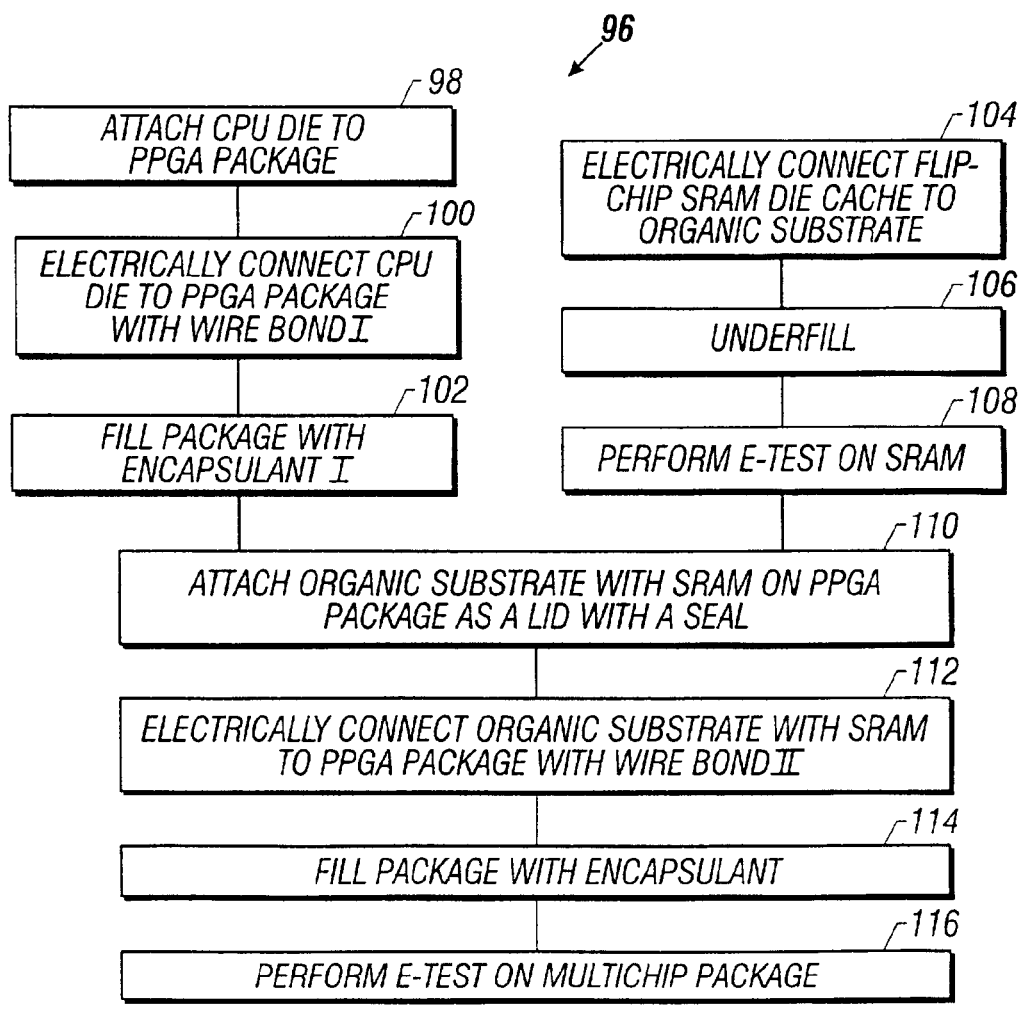
FIG. 6 is a manufacturing process flow for the multi-chip package illustrated in FIG. 5.

A third embodiment of the multi-chip package of the present invention is illustrated in the side cross-sectional view of FIG. 5. The multi-chip package 90 represents an organic PGA package 93 with a standard CPU die 26 with a C4, flip chip SRAM cache 74. The manufacturing process flow 96 for multi-chip package 90 is illustrated in the flowchart of FIG. 6.

The multi-chip package 90 can be fabricated in a similar process flow as that discussed above with respect to multi-chip package 70. A CPU die 26 is first attached to a slug 24 (step 98). The slug 24 supporting the CPU die 26 is then attached to the organic package 93, where the CPU die 26 is electrically connected to the package 93 via wire bonds I 28 and 30 (step 100). Note that the organic package 93 is comprised of a series of layers or shelves 14, 16, 18, 20, and 22, and has connector pins 94 staked through (or extending through) the package 93 to allow the multi-chip package 90 to be electrically coupled to other devices (e.g., a PCB). Once the CPU die 26 and slug 24 are attached to the chip package 17, a first encapsulant tills the area 92 above the CPU die 26. The encapsulant is generally an epoxy used for environmental protection of the die 26.

The SRAM cache 74 is mounted to an organic substrate 91 through use of solder balls 72 (step 104). In one embodiment, the organic substrate 91 is an organic PCB substrate. A standard flip chip substrate may be used for the SRAM cache 74. An underfill coating (not shown) may be applied to further secure the SRAM cache 74 to the substrate 91 (step 106). Once the SRAM cache 74 is electrically mounted on the substrate 91, a functionality test is performed to verify performance of the SRAM chip (step 108). If the SRAM chip is satisfactory, fabrication of the multi-chip package 90 may continue, otherwise the SRAM chip will be replaced.

Once the SRAM cache 74 mounted on the organic substrate 91 is tested and deemed satisfactory, the combined cache 74 and substrate 91 is attached to a shelf 18 of organic package 93, with the organic substrate 91 functioning as a lid above the CPU die 26 (step 110). A seal 42 is between the base of the substrate 91 and the upper edge of the shelf 18 it resides on. After the substrate 91 has been attached and sealed to the shelf 18 of the organic package the organic package 93 using wire bonds II 38 (112). In this manner, the SRAM cache 74 is electrically coupled to the chip package 93. The multi-chip package 90 is filled (above the SRAM cache 74 and substrate 91) with a second encapsulant 40 (step 114). Once the multi-chip package 90 is fully fabricated, a final functionality test may be applied to the device as a whole (step 116).

Figure 7:
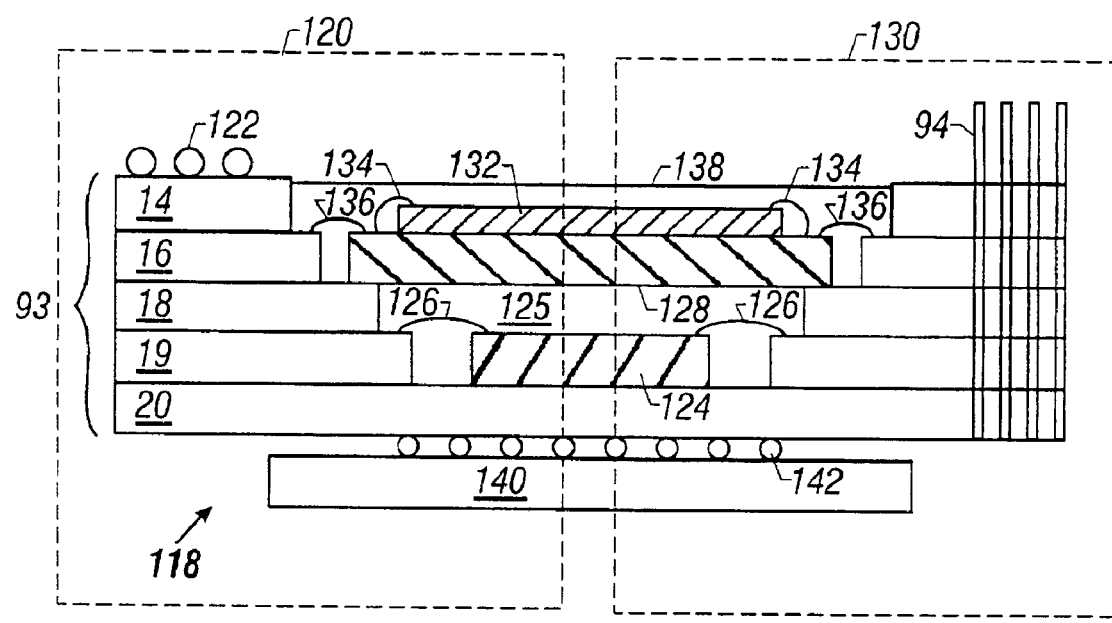
FIG. 7 is a multi-chip package of the present invention representing either a PPGA or CPGA package with a standard flip chip (C4) CPU die, a wire bonded SRAM cache, and a wire bonded security chip.

A fourth embodiment of the multi-chip package of the present invention is illustrated in the side cross-sectional view of FIG. 7. The multi-chip package 118 is illustrated in two sections for exemplary purposes only. A first section 120 represents an organic LGA package and a second section 130 represents a plastic PGA package. Note that in this embodiment of the present invention, the multi-chip package 118 has 3 semiconductor devices.

The multi-chip package 118 can be fabricated in a similar process flow as that discussed above with respect to multi-chip package 70. A semiconductor die 124 is first attached to the bottom shelf 20 of the package 93, and then electrically connected to the package 93 via wire bonds I 126. Once the semiconductor die 124 is attached to the chip package 93, a first encapsulant may fill the area 125 above the semiconductor die 118.

The SRAM cache 132 is mounted on a ceramic substrate 128 and electrically connected by a wire bond II 134. Once the SRAM cache 132 is electrically coupled to the substrate 128, a functionality test is performed to verify performance of the SRAM chip. If the SRAM chip is satisfactory, fabrication of the multi-chip package 118 may continue, otherwise the SRAM chip will be replaced.

Once the SRAM cache 132 mounted on the ceramic substrate 128 is tested and deemed satisfactory, the combined cache 132 and substrate 128 is attached to a shelf 16 of organic package 93, with the ceramic substrate 128 functioning as a lid above the semiconductor die 124. After the substrate 128 has been attached and sealed to the shelf 16 of the organic package 93, the substrate 128 is electrically connected to the organic package 93 using wire bond III 136. In this manner, the SRAM cache 132 is electrically coupled to the chip package 93. The multi-chip package 118 is filled (above the SRAM cache 132 and substrate 128) with an encapsulant 138. The partially fabricated multi-chip package 118 may be tested for functionality at this stage of fabrication also before proceeding.

Once any testing is complete, a CPU device 140 is mounted to the base of the package 93 and electrically connected through use of the solder balls 142. In this manner, the multi-chip package 118 may be used to mount a plurality of semiconductor devices to, for example, a PCB in a single chip footprint. Standard single package PGA and BGA options have not been capable of supporting multi-chip formats without expanding the footprint of the package. Thus, the present invention provides significant advantages over the prior art.

I claim:

1. A method of constructing a multi-chip package, comprising:

attaching a semiconductor die to a slug;

attaching the slug to a base of a package;

electrically connecting said semiconductor die to at least one of a plurality of shelves of the package;

electrically connecting a flip-chip to a substrate;

attaching said substrate to one of said plurality of shelves; and disposing a seal between a base of said substrate and the one of said plurality of shelves to which said substrate is attached, wherein a cavity is formed between said substrate and said base of said package, the cavity comprising only said semiconductor die.

2. The method of claim 1, further comprising electrically connecting said substrate to at least one of said plurality of shelves.

3. The method of claim 2, wherein electrically connecting said substrate to at least one of said plurality of shelves comprises electrically connecting said substrate to at least one of said plurality of shelves with at least one bond wire.

4. The method of claim 1, wherein attaching said substrate to one of said plurality of shelves provides a lid above said semiconductor die.

5. The method of claim 1, further comprising electrically testing said electrically connected flip-chip before attaching of said substrate to said one of said plurality of shelves.

6. The method of claim 1, wherein electrically connecting said flip-chip to said substrate comprises electrically connecting said flip-chip to said substrate with solder balls.

7. The method of claim 1, further comprising covering said flip-chip with an encapsulant.

8. The method of claim 1, wherein electrically connecting said semiconductor die to said at least one of a plurality of shelves comprises electrically connecting a CPU chip to said at least one of said plurality of shelves.

9. The method of claim 1, wherein electrically connecting said flip-chip to said substrate comprises electrically connecting a memory cache flip-chip to said substrate.

10. The method of claim 1, wherein electrically connecting said semiconductor die to at least one of said plurality of shelves comprises electrically connecting said semiconductor die to said at least one of a plurality of shelves with at least one bond wire.

11. The method of claim 1 wherein attaching said semiconductor die to a slug comprises attaching said semiconductor die to a slug comprising copper.

* * * * *

UNITED STATES PATENT AND TRADEMARK OFFICE
CERTIFICATE OF CORRECTION

PATENT NO. : 6,890,798 B2
DATED : May 10, 2005
INVENTOR(S) : McMahon

It is certified that error appears in the above-identified patent and that said Letters Patent is hereby corrected as shown below:

Column 6,
Line 18, delete "tills" and insert -- fills --.

Signed and Sealed this

Twelfth Day of July, 2005

JON W. DUDAS
*Director of the United States Patent and Trademark Office*